(12) United States Patent
Pham et al.

(10) Patent No.: US 8,537,956 B1
(45) Date of Patent: Sep. 17, 2013

(54) TECHNIQUES FOR GENERATING FRACTIONAL PERIODIC SIGNALS

(75) Inventors: Tien Duc Pham, San Jose, CA (US); Leon Zheng, San Francisco, CA (US); Sergey Shumarayev, Los Altos Hills, CA (US); Zhi Y. Wong, San Jose, CA (US); Paul B. Ekas, Redwood City, CA (US)

(73) Assignee: Altera Corporation, San Jose, CA (US)

(*) Notice: Subject to any disclaimer, the term of this patent is extended or adjusted under 35 U.S.C. 154(b) by 352 days.

(21) Appl. No.: 12/954,514

(22) Filed: Nov. 24, 2010

(51) Int. Cl.
*H03D 3/24* (2006.01)

(52) U.S. Cl.
USPC ........... 375/376; 375/373; 375/371; 375/354; 375/316

(58) Field of Classification Search
USPC .......................... 375/376, 373, 371, 354, 316
See application file for complete search history.

(56) References Cited

U.S. PATENT DOCUMENTS

| | | | | |
|---|---|---|---|---|
| 6,044,124 A | * | 3/2000 | Monahan et al. | 375/376 |
| 6,823,033 B2 | * | 11/2004 | Fahim | 375/376 |
| 7,075,384 B2 | * | 7/2006 | Tamura | 332/127 |
| 7,365,580 B2 | * | 4/2008 | Martin et al. | 327/156 |
| 8,174,326 B1 | * | 5/2012 | Li | 331/23 |
| 8,369,476 B2 | * | 2/2013 | Tseng et al. | 377/47 |
| 2003/0174799 A1 | * | 9/2003 | Fahim | 375/376 |
| 2003/0224748 A1 | | 12/2003 | Gomez et al. | |
| 2008/0063130 A1 | * | 3/2008 | Chen | 375/376 |
| 2010/0164562 A1 | * | 7/2010 | Tseng et al. | 327/118 |
| 2012/0235714 A1 | * | 9/2012 | Marienborg et al. | 327/115 |

OTHER PUBLICATIONS

"Enabling 100-Gbit OTN Muxponder Solutions on 28-nm FPGAs," White Paper, Altera Corp., Apr. 2010, ver. 1.0, pp. 1-7.

* cited by examiner

*Primary Examiner* — Kenneth Lam
(74) *Attorney, Agent, or Firm* — Steven J. Cahill

(57) ABSTRACT

A demultiplexer circuit separates input data having different data rates into output data. A phase-locked loop circuit generates first clock signals having average frequencies that are based on a frequency of a second clock signal times a fractional, non-integer number. A serializer circuit serializes a set of the output data to generate serial data signals in response to one of the first clock signals generated by the phase-locked loop circuit.

20 Claims, 10 Drawing Sheets

TECHNIQUES FOR GENERATING FRACTIONAL PERIODIC SIGNALS

BACKGROUND

The present invention relates to electronic circuits, and more particularly, to techniques for generating periodic signals having fractional frequencies.

New applications such as peer-to-peer sharing, social networking, digital video transmission, broadband wireless handsets and video conferencing and messaging have driven a need for data transport systems that have a larger bandwidth. With the introduction and adoption of 40-/100-Gbit (Gigabit) Ethernet, and the acceptance of optical transport network (OTN) standards, service providers are now turning to 100-Gbit OTN solutions to scale their channel capacity by a factor of ten.

However, there are a large number of legacy SONET, Ethernet, and storage systems operating at lower data rates, which somehow must be connected into the emerging OTN infrastructure. One way to connect the OTN infrastructure with the legacy systems that maximizes the available bandwidth while reducing space and power, is to aggregate multiple lower data-rate client channels onto a single wavelength at a higher data rate using a 100-Gbit OTN multiplexing transponder (muxponder).

FIG. 1 illustrates an example of a prior art transmission system having transponders 101-102. Transponder 101 functions as a multiplexing transponder 101 in the transmission system of FIG. 1, and transponder 102 functions as a demultiplexing transponder in the transmission system of FIG. 1. Multiplexing transponder 101 receives an N number of input client signals I1-IN (e.g., 16) that comprise data. Client signals I1-IN have different data rates and are generated according to different data transmission protocols. The data rates of client signals I1-IN are less than 100 Gigabits per second (Gbps). Multiplexing transponder 101 combines client signals I1-IN into a single high speed 100 Gbps data stream TS that is transmitted through OTN 103 to demultiplexing transponder 102. Demultiplexing transponder 102 separates data stream TS into an N number of lower speed output data signals O1-ON (e.g., 16). Output data signals O1-ON correspond to input client signals I1-IN, respectively.

FIG. 2 illustrates details of demultiplexing transponder 102 shown in FIG. 1. Demultiplexing transponder 102 includes demultiplexer 201, an N number of first-in-first-out (FIFO) buffers including FIFO buffers 202 and 212, an N number of controllers including controllers 203 and 213, an N number of soft intellectual property (IP) circuits including soft IP circuits 204 and 214, an N number of serializer/deserializer (SerDes) circuits including SerDes circuits 205 and 215, and an N number of transmitter phase-locked loop (TxPLL) circuits including TxPLL circuits 206 and 216. Demultiplexing transponder 102 is connected to an N number of external voltage-controlled crystal oscillator (VCXO) circuits including VCXO circuits 207 and 217. Transponder 102 is in an integrated circuit. The VCXO circuits are not in the integrated circuit that includes transponder 102.

Demultiplexer 201 separates data stream TS into an N number of data streams P1-PN. FIFO buffers 202 and 212 store the data signals in data streams P1 and PN, respectively. FIFO buffers 202 and 212 output the data signals in parallel as data signals F1 and FN, respectively. Controllers 203 and 213 generate error signals that indicate frequency shifts in the data signals stored in FIFO buffers 202 and 212, respectively. Soft IP circuits 204 and 214 generate digital control signals D1 and DN based on the error signals generated by controllers 203 and 213, respectively.

VCXO circuits 207 and 217 generate reference clock signals R1 and RN that are provided to inputs of TxPLL circuits 206 and 216, respectively. VCXO circuits 207 and 217 vary the frequencies of reference clock signals R1 and RN based on signals D1 and DN indicating frequency shifts in the data signals stored in FIFO buffers 202 and 212, respectively. TxPLL circuits 206 and 216 multiply the frequencies of reference clock signals R1 and RN to generate the frequencies of clock signals C1 and CN, respectively. Serializer circuits in SerDes circuits 205 and 215 convert parallel data signals F1 and FN received from FIFO buffer circuits 202 and 212 into serial output data signals O1 and ON in response to clock signals C1 and CN, respectively.

BRIEF SUMMARY

According to some embodiments, a demultiplexer circuit separates input data having different data rates into output data. A phase-locked loop circuit generates first clock signals having average frequencies that are based on a frequency of a second clock signal times a fractional, non-integer number. A serializer circuit serializes a set of the output data to generate serial data signals in response to one of the first clock signals generated by the phase-locked loop circuit.

Various objects, features, and advantages of the present invention will become apparent upon consideration of the following detailed description and the accompanying drawings.

DETAILED DESCRIPTION

Figure 1:
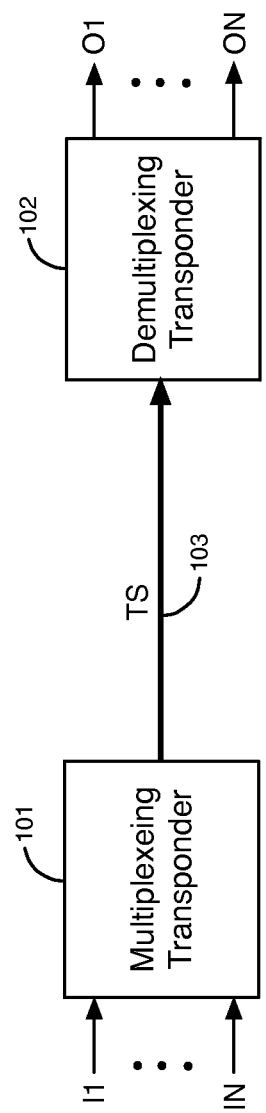
FIG. 1 illustrates an example of a prior art transmission system having transponders.
Figure 2:
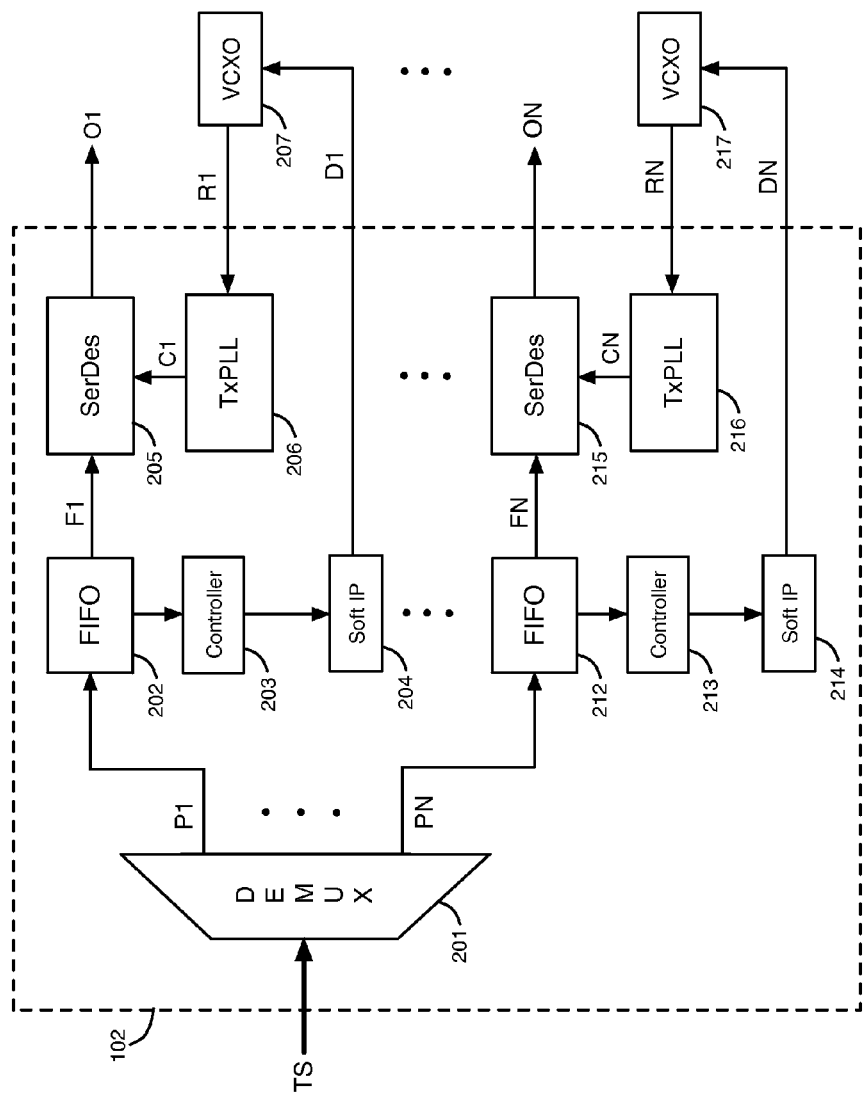
FIG. 2 illustrates details of the demultiplexing transponder shown in FIG. 1.
Figure 3:
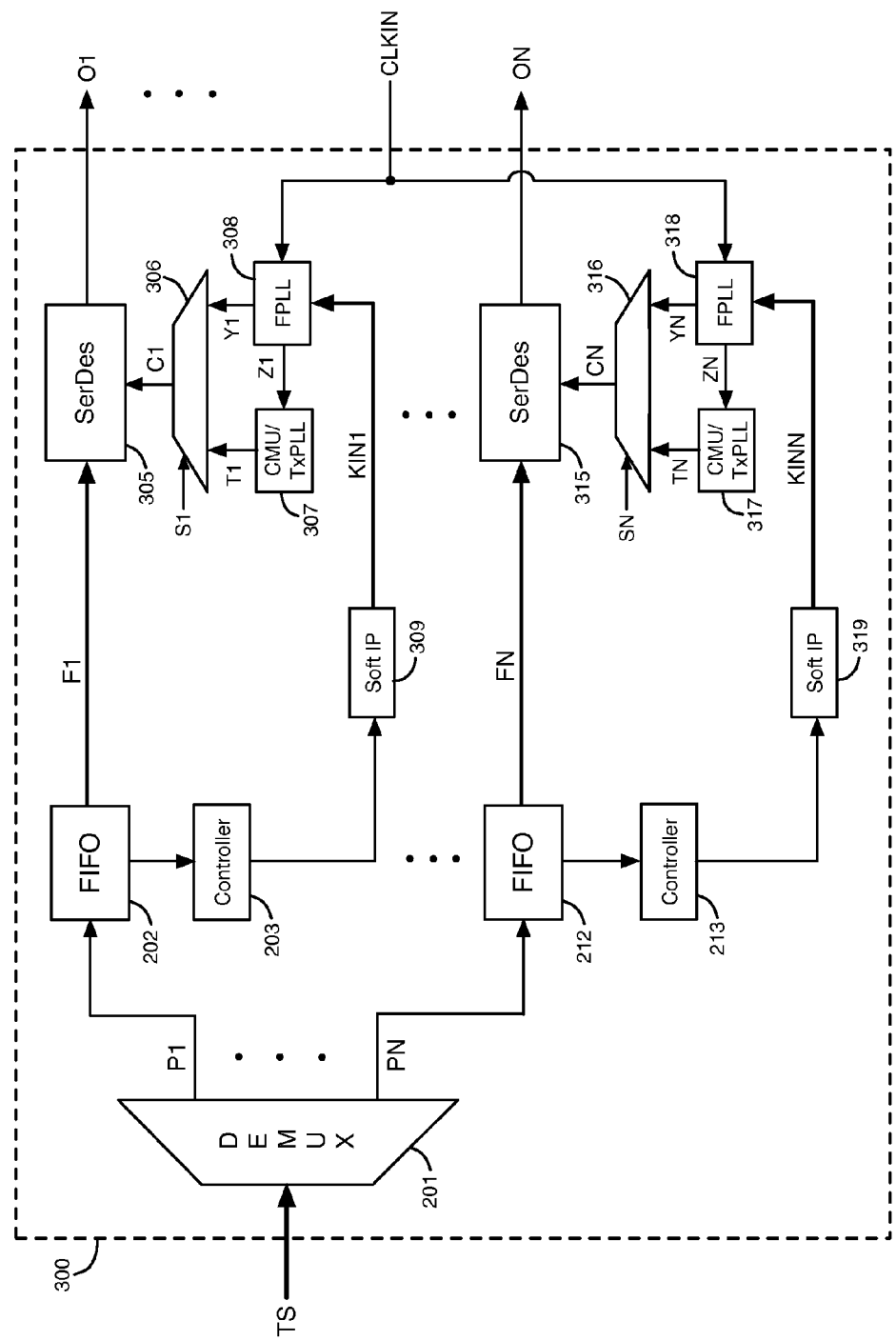
FIG. 3 illustrates a demultiplexing transponder circuit, according to an embodiment of the present invention.

FIG. 3 illustrates a demultiplexing transponder circuit 300, according to an embodiment of the present invention. Demultiplexing transponder 300 separates data stream TS into an N number of output data signals O1-ON (e.g., 16). The VCXO circuits shown in FIG. 2 are costly and require extra space on a circuit board. Demultiplexing transponder circuit 300 does not require external VCXO circuits to generate reference clock signals for the transmitter phase-locked loop circuits. Instead, demultiplexing transponder 300 includes on-chip fractional phase-locked loop (FPLL) circuits that generate reference clock signals for the transmitter phase-locked loop circuits.

Demultiplexing transponder circuit 300 includes demultiplexer (DEMUX) 201, an N number of first-in-first-out (FIFO) buffers including FIFO buffers 202 and 212, an N number of controllers including controllers 203 and 213, an N number of soft intellectual property (IP) circuits including soft IP circuits 309 and 319, an N number of serializer/deserializer (SerDes) circuits including SerDes circuits 305 and 315, an N number of transmitter phase-locked loop (TxPLL) circuits including TxPLL circuits 307 and 317, an N number of multiplexer circuits including multiplexer circuits 306 and 316, and an N number of fractional phase-locked loop (FPLL) circuits including FPLL circuits 308 and 318. In the embodiment of FIG. 3, the number N can be any suitable positive integer greater than 1 (e.g., 16).

Demultiplexing transponder circuit 300 includes an N number of channels. Each of the channels includes a FIFO buffer, a controller, a soft IP circuit, a SerDes circuit, a TxPLL circuit, a multiplexer circuit, and an FPLL circuit. The channels in transponder circuit 300 generate an N number of output data signals O1-0N. The channels in transponder circuit 300 can generate output data signals having different data rates that are generated according to different data transmission protocols. For example, the channels in transponder circuit 300 can generate an N number of output data signals O1-ON that have N different data rates and that are generated according to an N number of data transmission protocols. The channels in transponder circuit 300 generate clock signals C1-CN that are used to sample the output data signals O1-0N, respectively. The channels can change the frequencies of the clock signals C1-CN used to sample the output data signals O1-ON independently of each other and on-the-fly.

Demultiplexer 201, FIFO buffers 202 and 212, and controllers 203 and 213 function as described above with respect to FIG. 2. Demultiplexer transponder circuit 300 is in an integrated circuit. All of the components of demultiplexing transponder circuit 300 including FPLL circuits 308 and 318 are in the same integrated circuit. Output clock signals Z1 and ZN generated by FPLL circuits 308 and 318 are used as reference clock signals for TxPLL circuits 307 and 317, respectively. Because FPLL circuits 308 and 318 are on-chip, the embodiment of FIG. 3 reduces the cost and the board space used to generate reference clock signals for TxPLL circuits 307 and 317.

An input clock signal CLKIN is provided from a source that is external to demultiplexing transponder 300 to inputs of the FPLL circuits in demultiplexing transponder 300, including FPLL circuits 308 and 318. FPLL circuit 308 generates multiple periodic output clock signals including periodic clock signals Y1 and Z1 in response to input clock signal CLKIN. FPLL circuit 318 generates multiple periodic output clock signals including periodic clock signals YN and ZN in response to input clock signal CLKIN. The frequencies of the clock signals generated by each of the FPLL circuits in transponder circuit 300 are programmable. The FPLL circuits in transponder circuit 300 can be programmed independently of each other to generate clock signals having different frequencies.

The soft IP circuits in demultiplexing transponder 300 include programmable logic circuits. Soft IP circuits 309 and 319 each generate an N number of digital control signals based on the error signals generated by controllers 203 and 213, respectively. For example, soft IP circuit 309 generates control signals KIN1 based on error signals generated by controller 203. Soft IP circuit 319 generates control signals KINN based on error signals generated by controller 213.

Control signals KIN1 and KINN are provided to inputs of FPLL circuits 308 and 318, respectively. FPLL circuit 308 varies the frequencies of output clock signals Y1 and Z1 based on control signals KIN1 indicating frequency shifts in the data signals stored in FIFO buffer 202. FPLL circuit 318 varies the frequencies of output clock signals YN and ZN based on control signals KINN indicating frequency shifts in the data signals stored in FIFO buffer 212. Further details of the structure and function of the FPLL circuits in demultiplexing transponder 300 are shown in and described below with respect to FIGS. 6-8.

The FPLL circuits in demultiplexing transponder 300 generate output clock signals having a high resolution in the sense that the FPLL circuits can generate comparatively small changes in the average frequencies of their output clock signals in response to changes in control signals KIN1-KINN. For example, FPLL circuits 308 and 318 can generate relatively small changes in the average frequencies of clock signals Y1, Z1 and YN, ZN in response to changes in control signals KIN1 and KINN, respectively.

Clock signals Z1 and ZN are provided to inputs of TxPLL circuits 307 and 317, respectively. TxPLL circuits 307 and 317 generate high frequency periodic output clock signals T1 and TN in response to high resolution, lower frequency clock signals Z1 and ZN, respectively. TxPLL circuits 307 and 317 are each part of a clock multiplier unit (CMU). TxPLL circuits 307 and 317 multiply the frequencies of the lower frequency clock signals Z1 and ZN to generate output clock signals T1 and TN that have substantially higher frequencies than clock signals Z1 and ZN, respectively.

Clock signals T1 and Y1 are provided to multiplexing inputs of multiplexer 306. Multiplexer 306 provides one of clock signals T1 or Y1 to a clock input of SerDes circuit 305 as clock signal C1 in response to select signal S1. Clock signals TN and YN are provided to multiplexing inputs of multiplexer 316. Multiplexer 316 provides one of clock signals TN or YN to SerDes circuit 315 as clock signal CN in response to select signal SN. The select signals S1 and SN are set to values that cause multiplexers 306 and 316 to provide either the lower frequency clock signals Y1 and YN or the higher frequency clock signals T1 and TN to SerDes circuits 305 and 315, respectively. Serializer circuits in SerDes circuits 305 and 315 convert parallel data signals F1 and FN received from FIFO buffer circuits 202 and 212 into serial output data signals O1 and ON in response to clock signals C1 and CN, respectively.

Each of the TxPLL circuits in demultiplexing transponder circuit 300 generates a high frequency clock signal based on a lower frequency, high resolution clock signal generated by one of the FPLL circuits. The high frequency clock signal generated by each TxPLL circuit also has a high resolution that is based on the high resolution of the lower frequency clock signal received from the FPLL. The high frequency clock signal generated by the TxPLL circuit can be used to cause one of the serializer circuits to convert parallel data signals into a serial data signal having a high data rate.

If a parallel data stream from one of the FIFO buffers has a high data rate, the corresponding multiplexer provides a high frequency clock signal to the corresponding SerDes circuit. For example, if both sets of parallel data signals F1 and FN have high data rates, select signals S1 and SN are set to values that cause multiplexers 306 and 316 to provide high frequency clock signals T1 and TN to SerDes circuits 305 and 315 as clock signals C1 and CN, respectively. The serializer circuits in SerDes circuits 305 and 315 generate serial data signals O1 and ON having high data rates in response to high frequency clock signals T1 and TN, respectively.

If a parallel data stream from one of the FIFO buffers has a low data rate, the corresponding multiplexer provides a lower frequency clock signal to the corresponding SerDes circuit. For example, if both sets of parallel data signals F1 and FN have low data rates, select signals S1 and SN are set to values that cause multiplexers 306 and 316 to provide the lower frequency clock signals Y1 and YN to SerDes circuits 305 and 315 as clock signals C1 and CN, respectively. The serializer circuits in SerDes circuits 305 and 315 generate serial data signals O1 and ON having lower data rates in response to the lower frequency clock signals Y1 and YN, respectively.

Figure 4:
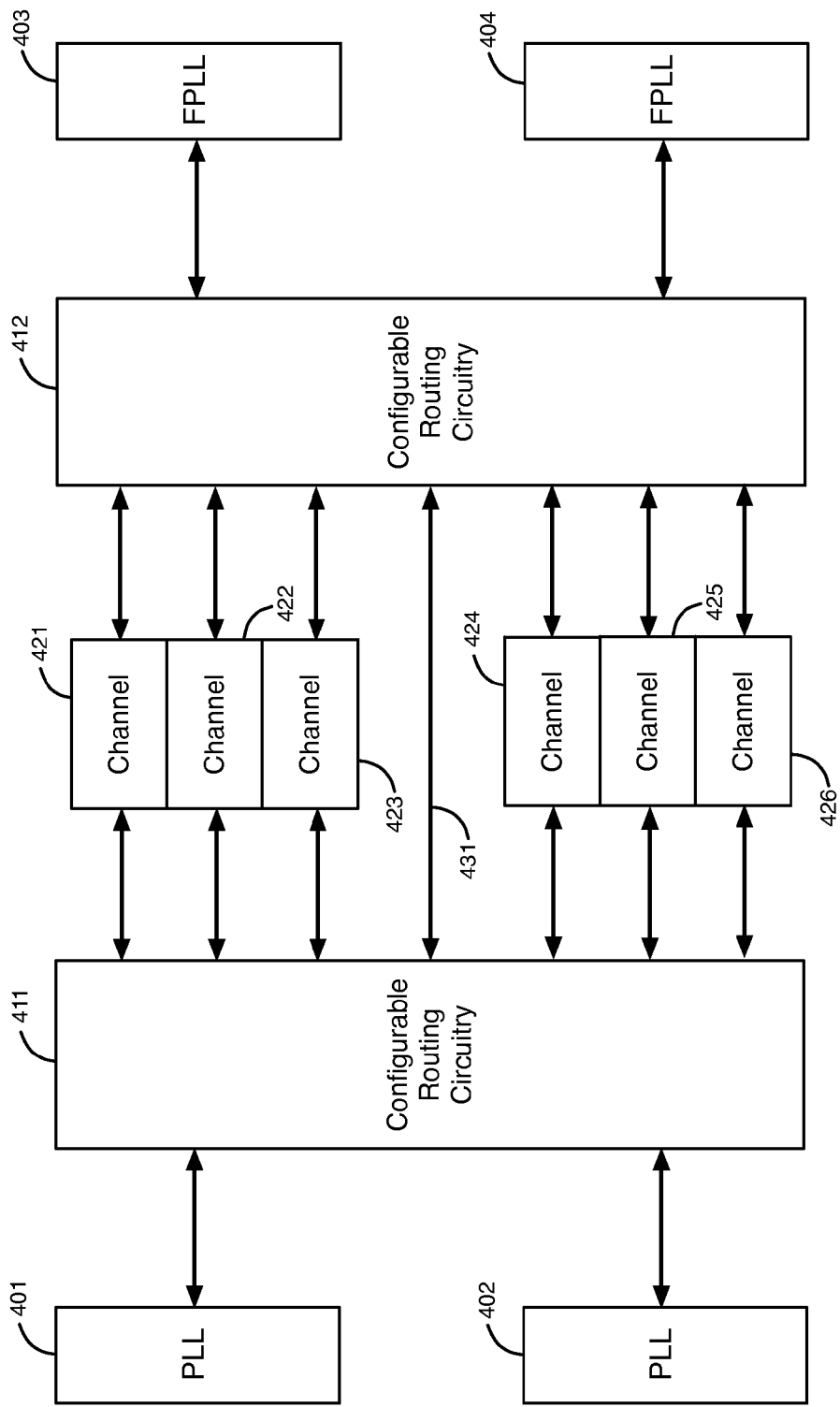
FIG. 4 illustrates phase-locked loop circuits, channel circuits, and configurable routing circuitry, according to another embodiment of the present invention.

FIG. 4 illustrates phase-locked loop circuits, channel circuits, and configurable routing circuitry, according to another embodiment of the present invention. In an embodiment, the circuitry shown in FIG. 4 is a part of demultiplexing transponder circuit 300 shown in FIG. 3. The circuitry of FIG. 4 includes phase-locked loop (PLL) circuits 401-402, fractional phase-locked loop (FPLL) circuits 403-404, configurable routing circuitry 411-412, and channel circuits 421-426. Each of PLL circuits 401-404 includes a voltage-controlled oscillator circuit that may, for example, be based on a ring oscillator circuit or an inductor-capacitor tank oscillator circuit. Configurable routing circuits 411-412 include multiplexer circuits, buffer circuits, and conductors that route clock signals between PLL circuits 401-404 and channel circuits 421-426. Each of the horizontal lines having two arrows in FIG. 4 represents a bus.

Each of FPLL circuits 403-404 can be configured to generate output clock signals having frequencies that equal the frequency of an input clock signal multiplied by a non-integer, fractional number. The input clock signal may, for example, be provided to FPLL circuits 403-404 from a source external to the integrated circuit through configurable routing circuitry 412. Configurable routing circuitry 412 can be configured to provide output clock signals of FPLL circuits 403-404 to any of channel circuits 421-426.

The output clock signals of FPLL circuits 403-404 can be provided to inputs of any of PLL circuits 401-402 through configurable routing circuitry 412, bus 431, and configurable routing circuitry 411. PLL circuits 401-402 can, for example, be part of clock multiplier units. PLL circuits 401-402 multiply the frequencies of the output clock signals of FPLL circuits 403-404 to generate output clock signals having higher frequencies than the frequencies of the output clock signals of FPLL circuits 403-404, as described above with respect to PLL circuits 307-308 and 317-318. The output clock signals of PLL circuits 401-402 can be provided to any of channel circuits 421-426 through configurable routing circuitry 411.

Figure 5:
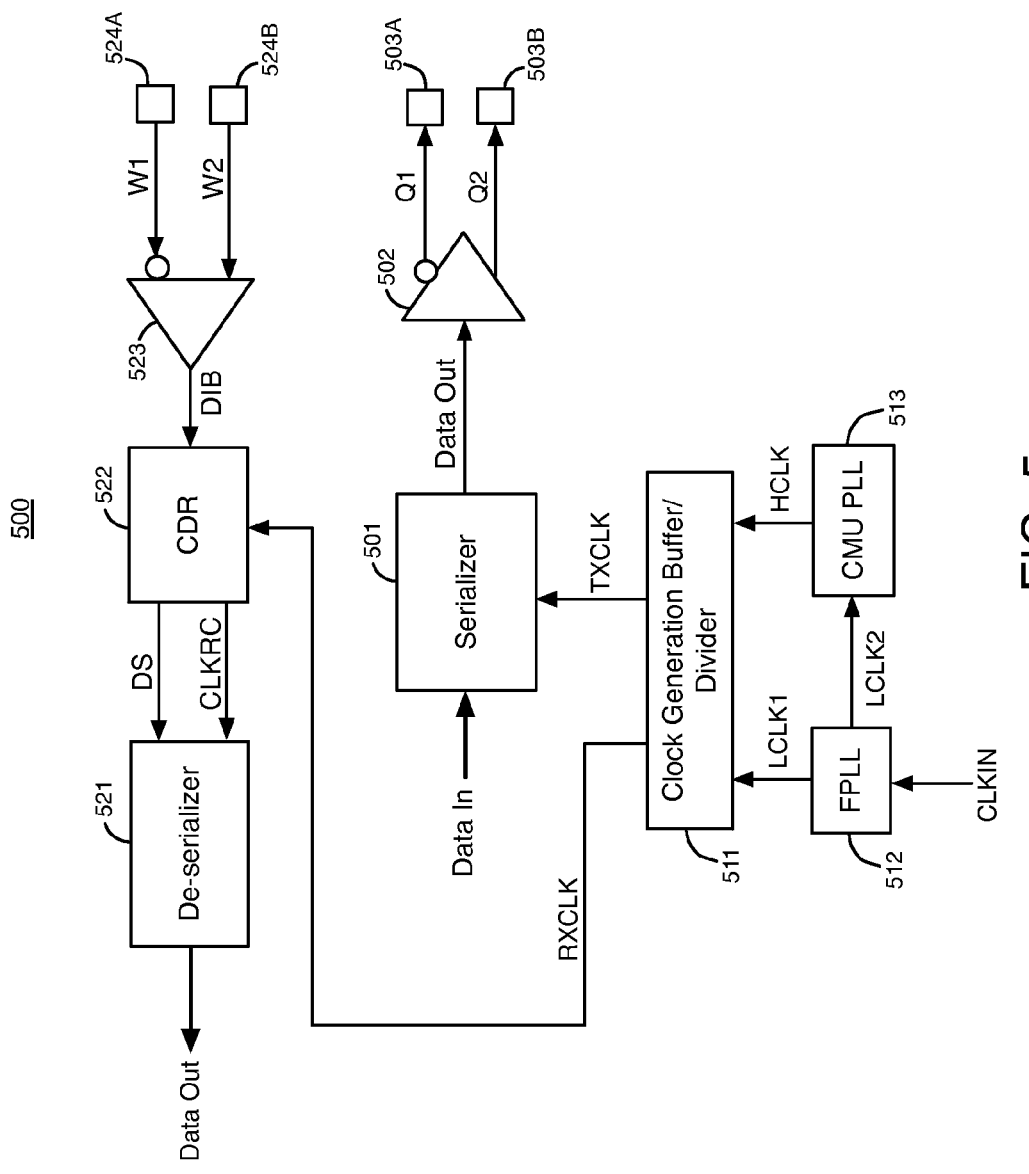
FIG. 5 illustrates an example of a channel circuit, according to another embodiment of the present invention.

FIG. 5 illustrates an example of a channel circuit 500, according to another embodiment of the present invention. Channel circuit 500 is an example of each of the channel circuits 421-426 shown in FIG. 4. Channel circuit 500 includes a transmitter portion and a receiver portion. The transmitter portion of channel circuit 500 includes a serializer circuit 501, a driver circuit 502, and output pins 503A-503B. The receiver portion of channel circuit 500 includes deserializer circuit 521, clock data recovery (CDR) circuit 522, buffer circuit 523, and input pins 524A-524B.

Serializer 501 in the transmitter portion of channel circuit 500 receives parallel input data signals (Data In). The input data signals Data In can be, for example, input data signals F1 or FN received from one of FIFO buffers 202 or 212, respectively. Serializer 501 converts the parallel input data signals Data In into a serial output data signal Data Out in response to a clock signal TXCLK. Serializer 501 can, for example, be a shift register that shifts incoming bits in input data signals Data In through registers in response to clock signal TXCLK to generate bits in serial output data signal Data Out. The serial output data signal Data Out is provided to an input of driver circuit 502. Driver circuit 502 generates a differential output signal that includes signals Q1 and Q2 at pins 503A-503B, respectively. The differential output signal contains the data bits embodied in the serial data signal Data Out. Pins 503A-503B are connected to differential outputs of driver circuit 502.

Channel circuit 500 also includes clock generation buffer and divider circuit 511, fractional phase-locked loop (FPLL) circuit 512, and a phase-locked loop (PLL) circuit 513 functioning as a clock multiplier unit (CMU). FPLL 512 generates low frequency, high resolution output clock signals LCLK1 and LCLK2 in response to an input reference clock signal CLKIN. FPLL 512 can be configured to cause the frequencies of output clock signals LCLK1 and LCLK2 to equal the frequency of clock signal CLKIN multiplied by a non-integer, fractional number. PLL circuit 513 generates a high frequency output clock signal HCLK by multiplying the frequency of clock signal LCLK2 by a positive integer.

Clock signal LCLK1 and clock signal HCLK are provided to inputs of clock generation buffer and divider circuit 511. Clock generation buffer and divider circuit 511 contains a frequency divider circuit such as a counter circuit, two buffer circuits, and two multiplexer circuits. Each of the multiplexer circuits in clock generation buffer and divider circuit 511 selects one of clock signals LCLK1 or HCLK as a selected clock signal. The frequency divider circuit in clock generation buffer and divider circuit 511 divides the frequency of each of the selected clock signals by a non-zero positive integer number to generate the frequencies of two frequency divided clock signals. The frequency of each of the frequency divided clock signals equals the frequency of the selected clock signal divided by a non-zero positive integer number.

The clock buffer circuits in clock generation buffer and divider circuit 511 buffer the frequency divided clock signals to generate buffered clock signals TXCLK and RXCLK. Clock signal TXCLK is provided to an input of serializer circuit 501. As discussed above, serializer 501 converts the parallel data bits in input data signals Data In into serial data bits in serial output data signal Data Out in response to clock signal TXCLK.

Clock signal RXCLK is provided to an input of CDR circuit 522. A differential input data signal that includes signals W1 and W2 is provided from an external source through pins 524A-524B to differential inputs of buffer circuit 523. Buffer circuit 523 buffers the differential input data signal to generate a buffered input data signal DIB. Buffered input data signal DIB is provided to an input of CDR circuit 522. CDR circuit 522 generates a recovered clock signal CLKRC based on clock signal RXCLK and buffered input data signal DIB. CDR circuit 522 generates sampled data signal DS based on buffered input data signal DIB. Recovered clock signal CLKRC and sampled data signal DS are provided to inputs of de-serializer circuit 521. De-serializer circuit 521 converts the serial data bits in sampled data signal DS into parallel data bits in parallel output data signal Data Out using recovered clock signal CLKRC.

Figure 6:
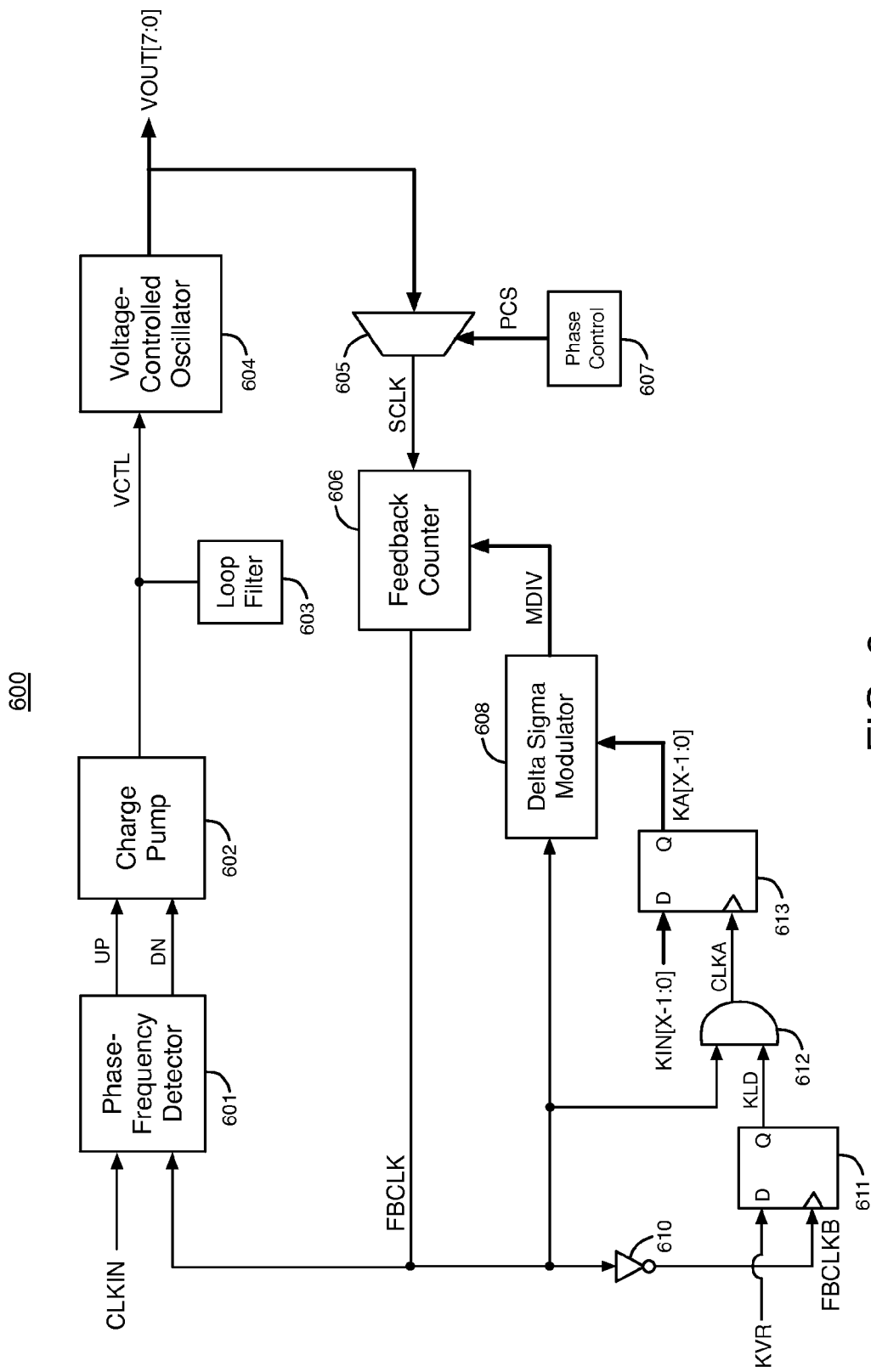
FIG. 6 illustrates a fractional phase-locked loop circuit, according to an embodiment of the present invention.

FIG. 6 illustrates a fractional phase-locked loop circuit 600, according to an embodiment of the present invention. Fractional phase-locked loop (FPLL) circuit 600 is an example of each of the FPLL circuits in FIGS. 3-5. In an embodiment, each of FPLL circuit 308, FPLL circuit 318, FPLL circuit 403, FPLL circuit 404, and FPLL circuit 512 has the circuit structure of FPLL circuit 600.

FPLL circuit 600 includes phase frequency detector (PFD) circuit 601, charge pump circuit 602, loop filter circuit 603, voltage-controlled oscillator (VCO) circuit 604, multiplexer circuit 605, feedback counter circuit 606, phase control circuit 607, delta sigma modulator circuit 608, inverter circuit 610, D flip-flop circuit 611, AND logic gate 612, and D flip-flop circuits 613. D flip-flop circuits 611 and 613 are storage circuits.

Phase-frequency detector (PFD) 601 compares the phase and the frequency of input reference clock signal CLKIN to the phase and the frequency of a feedback clock signal FBCLK generated by feedback counter circuit 606. Phase-frequency detector 601 generates UP and DN (down) error signals that are indicative of the differences between the phases and the frequencies of input reference clock signal CLKIN and feedback clock signal FBCLK.

The UP and DN error signals are provided to inputs of charge pump 602. Charge pump 602 converts the UP and DN error signals into a control voltage, and loop filter 603 filters the control voltage to generate a filtered control voltage VCTL. The filtered control voltage VCTL is provided to an input of voltage-controlled oscillator (VCO) 604. Loop filter 603 is a low pass filter that attenuates high frequency components of control voltage VCTL.

VCO 604 generates 8 periodic output clock signals VOUT [7:0]. The relative phases of output clock signals VOUT[7:0] are 0°, 45°, 90°, 135°, 180°, 225°, 270°, and 315°. VCO 604 varies the frequencies of output clock signals VOUT[7:0] within a frequency range in response to changes in the control voltage VCTL.

Phase control circuit 607 generates phase control select signals PCS that are provided to select inputs of multiplexer circuit 605. Multiplexer circuit 605 selects one of the 8 output clock signals VOUT[7:0] of VCO 604 as selected clock signal SCLK based on the phase control select signals PCS generated by phase control circuit 607. The phase control select signals PCS control the phase of selected clock signal SCLK.

Feedback counter circuit 606 functions as a frequency divider circuit with respect to its input clock signal SCLK and its output clock signal FBCLK. Feedback counter circuit 606 divides the frequency of the clock signal SCLK selected by multiplexer circuit 605 by a frequency division value to generate the frequency of feedback clock signal FBCLK. Feedback counter circuit 606 allows VCO 604 to generate output clock signals VOUT[7:0] having frequencies that are greater than the frequency of input reference clock signal CLKIN.

FPLL 600 adjusts the control voltage VCTL to match both the phase and the frequency of feedback clock signal FBCLK with the phase and the frequency of input reference clock signal CLKIN. When the frequency of clock signal CLKIN is greater than the frequency of clock signal FBCLK, PFD 601 generates high pulses in the UP signal that are longer than high pulses in the DN signal. Charge pump 602 increases control voltage VCTL in response to high pulses in the UP signal that are longer than high pulses in the DN signal. VCO 604 increases the frequencies of clock signals VOUT[7:0] and SCLK in response to the increase in control voltage VCTL. Feedback counter circuit 606 increases the frequency of clock signal FBCLK in response to the increased frequency of clock signal SCLK.

When the frequency of clock signal FBCLK is greater than the frequency of clock signal CLKIN, PFD 601 generates high pulses in the DN signal that are longer than high pulses in the UP signal. Charge pump 602 decreases control voltage VCTL in response to high pulses in the DN signal that are longer than high pulses in the UP signal. VCO 604 decreases the frequency of clock signals VOUT[7:0] and SCLK in response to the decrease in control voltage VCTL. Feedback counter circuit 606 decreases the frequency of clock signal FBCLK in response to the decreased frequency of clock signal SCLK.

Feedback counter circuit 606 divides the frequency of clock signal SCLK by a frequency division value M to generate the frequency of feedback clock signal FBCLK. The frequency division value M of feedback counter circuit 606 is determined by the value of control signals MDIV generated by delta sigma modulator 608. Feedback counter circuit 606 changes the frequency division value M used to generate clock signal FBCLK between 2 or more frequency division values (e.g., 2-8 frequency division values) based on changes in control signals MDIV. By changing the frequency division value M used to generate clock signal FBCLK between 2 or more frequency division values, FPLL circuit 600 can generate output clock signals VOUT[7:0] having average frequencies that equal the frequency of clock signal CLKIN times a fractional, non-integer number. Delta sigma modulator 608 varies the value of control signals MDIV between two or more values to cause the frequency division value M of feedback counter circuit 606 to vary between 2 or more different frequency division values using a dithering technique.

An X number of control signals KIN[X-1:0] are provided to the D inputs of flip-flops 613. The value of control signals KIN[X-1:0] equals the fractional, non-integer number mentioned above that is used to generate the average frequencies of clock signals VOUT[7:0]. FPLL 600 has an X number of flip-flops 613, which are shown as a single box in FIG. 6 to simplify the drawing. Each of control signals KIN[X-1:0] is provided to the D input of a different one of the X flip-flops 613.

If FPLL circuit 600 is one of the FPLL circuits in demultiplexing transponder 300, then control signals KIN[X-1:0] are generated by one of the soft IP circuits in demultiplexing transponder 300. For example, if FPLL 600 is in FPLL 308, then control signals KIN[X-1:0] are control signals KIN1. As another example, if FPLL 600 is in FPLL 318, then control signals KIN[X-1:0] are control signals KINN.

Delta sigma modulator 608 sets the value of control signals MDIV based on the value of an X number of control signals KA[X-1:0], as described in detail below with respect to FIG. 8. Flip-flop 611, AND gate 612, and flip-flops 613 generate control signals KA[X-1:0] based on control signals KIN[X-1:0], a control signal KVR, and feedback clock signal FBCLK. Flip-flop 611, AND gate 612, and flip-flops 613 synchronize control signals KA[X-1:0] with feedback clock signal FBCLK to cause each of control signals KA[X-1:0] to be updated at the same time in response to a change in the value of control signals KIN[X-1:0]. If two or more of control signals KA[X-1:0] change states at different times during a change in the value of control signals KIN[X-1:0], delta sigma modulator 608 may generate an incorrect value in control signals MDIV, and FPLL 600 may generate incorrect frequencies in clock signals VOUT[7:0].

Figure 7:
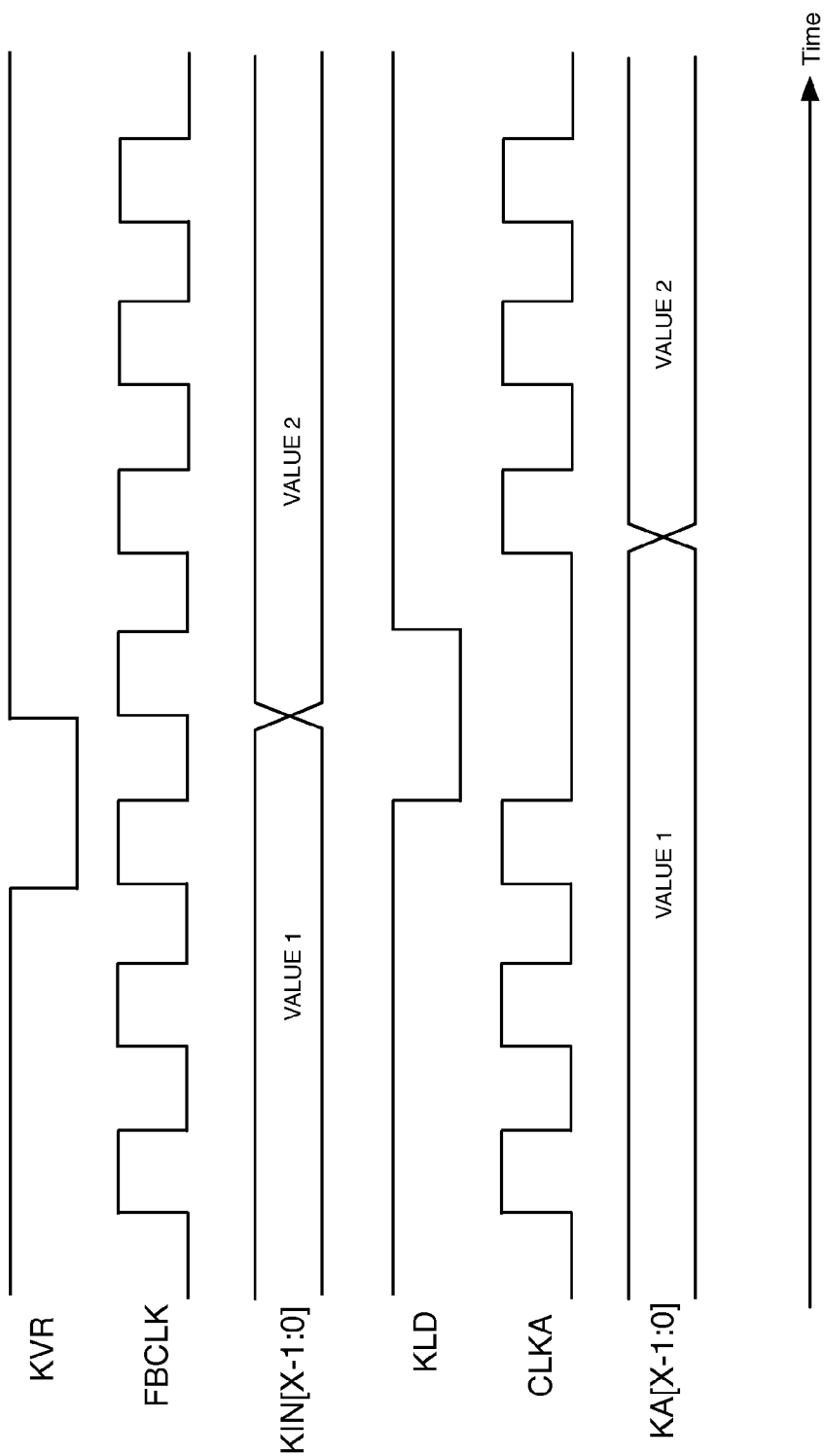
FIG. 7 is a timing diagram that illustrates example waveforms for some of the signals in the fractional phase-locked loop circuit shown in FIG. 6.

FIG. 7 is a timing diagram that illustrates example waveforms for some of the signals in FPLL circuit 600 shown in FIG. 6. FIG. 7 illustrates example waveforms for control signal KVR, feedback clock signal FBCLK, control signals KIN[X-1:0], signal KLD, clock signal CLKA, and control signals KA[X-1:0].

The operation of inverter 610, flip-flop 611, AND gate 612, and flip-flops 613 are now discussed in the context of the example waveforms shown in FIG. 7. Inverter 610 inverts feedback clock signal FBCLK to generate inverted clock signal FBCLKB at the clock input of flip-flop circuit 611. Control signal KVR is provided to the D input of flip-flop circuit 611. A logic low pulse (i.e., a falling edge followed by a rising edge) is generated in control signal KVR before each change that occurs in the value of control signals KIN[X-1:0]. Following a logic low pulse in control signal KVR, flip-flop circuit 611 generates a falling edge in signal KLD at its Q output in response to the next rising edge in clock signal FBCLKB (i.e., the next falling edge in FBCLK), as shown in FIG. 7.

AND logic gate circuit 612 generates clock signal CLKA by performing an AND logic function on the logic states of feedback clock signal FBCLK and signal KLD. Clock signal CLKA is provided to the clock input of each of flip-flops 613. When signal KLD is in a logic low state, AND logic gate 612 maintains clock signal CLKA in a logic low state. While clock signal CLKA is in a logic low state, the value of control signals KIN[X-1:0] changes from value 1 to value 2, as shown in FIG. 7. Flip-flops 613 only update the value of control signals KA[X-1:0] at their Q outputs in response to a rising edge in clock signal CLKA. Thus, while clock signal CLKA remains in a logic low state, the value of control signals KA[X-1:0] remains constant.

After the rising edge in signal KVR and the next rising edge in clock signal FBCLKB, flip-flop 611 generates a rising edge in signal KLD, and AND logic gate 612 begins to generate rising and falling edges in clock signal CLKA in response to clock signal FBCLK again. After the next rising edge in clock signal CLKA that occurs after the rising edge in signal KLD, flip-flops 613 update the value of control signals KA[X-1:0] from value 1 to value 2 to match the updated value 2 of control signals KIN[X-1:0]. As a result, FPLL 600 causes each of the control signals KA[X-1:0] to be updated at the same time in response to control signal KVR after the value of control signals KIN[X-1:0] has changed.

Delta sigma modulator 608 changes the value of control signals MDIV based on changes in the value of control signals KA[X-1:0]. Feedback counter circuit 606 causes the frequency of feedback clock signal FBCLK and the frequencies of output clock signals VOUT[7:0] to change based on changes in control signals MDIV. As an example, feedback counter circuit 606 may change the frequency division values that are used to generate clock signal FBCLK based on changes in control signals MDIV.

Figure 8:
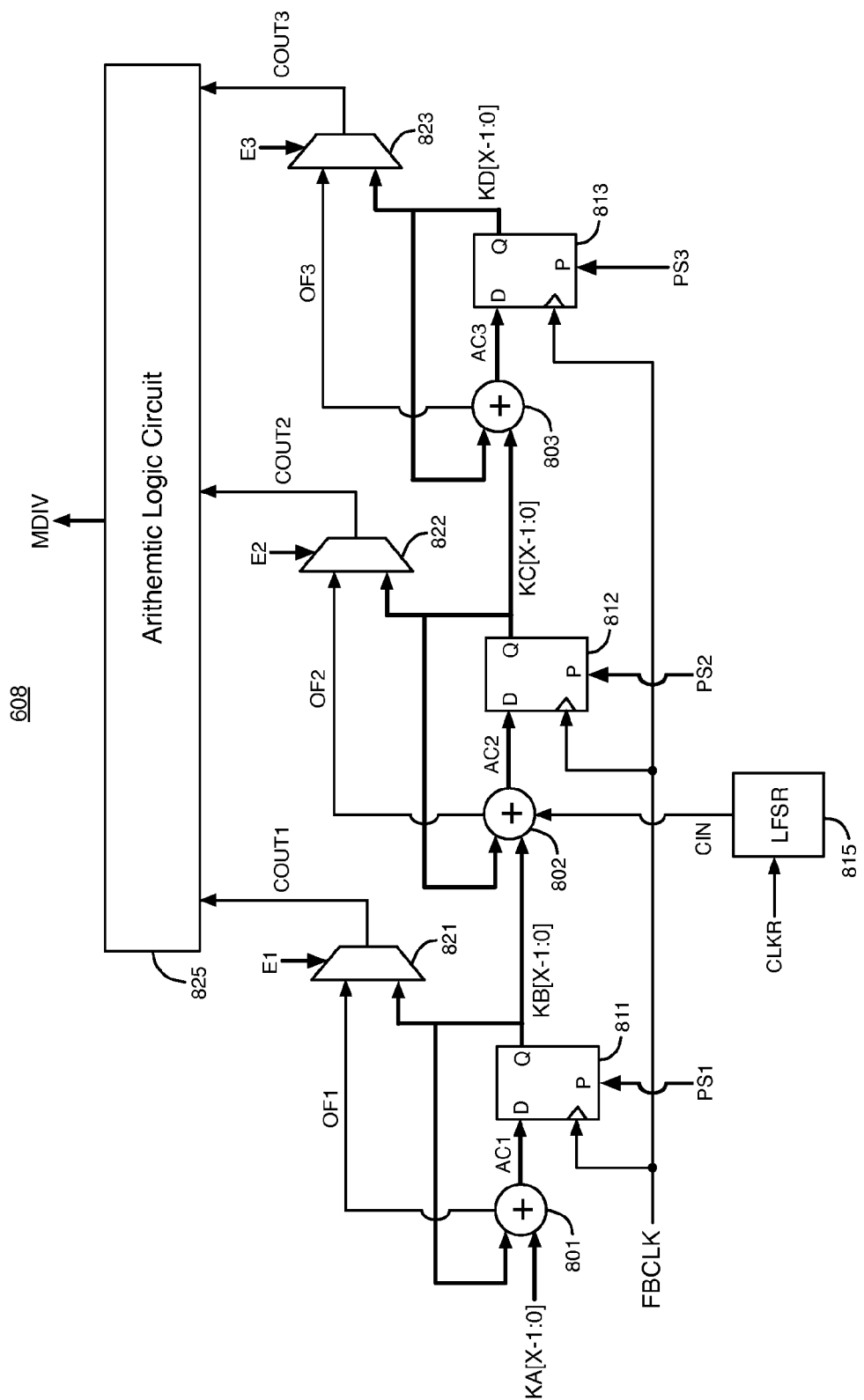
FIG. 8 illustrates an example of the delta sigma modulator circuit shown in FIG. 6, according to an embodiment of the present invention.

FIG. 8 illustrates an example of delta sigma modulator circuit 608 in FPLL circuit 600, according to an embodiment of the present invention. Delta sigma modulator circuit 608 includes accumulator circuits 801-803, D flip-flip circuits 811-813, linear feedback shift register (LFSR) circuit 815, multiplexer circuits 821-823, and arithmetic logic circuit 825. Flip-flop circuits 811-813 are storage circuits.

Each of the accumulator circuits 801-803 includes adder circuits and register circuits. The adder circuits in accumulator circuits 801-803 perform arithmetic addition functions adding together the values of their respective sets of input signals to generate sums that are represented by the values of their respective output signals. The registers in each of the accumulator circuits 801-803 store the sum of the arithmetic addition function performed by that accumulator circuit.

The registers in each of accumulator circuits 801-803 store an X number of digital signals indicating the sum of the arithmetic addition function performed by the respective accumulator circuit. Each of accumulator circuits 801-803 generates an X+1 number of digital output signals representing the sum of the arithmetic addition function performed by that accumulator circuit. X is a positive integer number greater than 1. In an embodiment, X equals 32.

Delta sigma modulator circuit 608 includes an X number of flip-flop circuits 811, an X number of flip-flop circuits 812, and an X number of flip-flop circuits 813. Each set of flip-flop circuits 811-813 is shown as a single box in FIG. 8 to simplify the drawing.

Preset signals PS1 are provided to preset inputs of flip-flop circuits 811. Preset signals PS2 are provided to preset inputs of flip-flop circuits 812. Preset signals PS3 are provided to preset inputs of flip-flop circuits 813. Before the normal operation of delta sigma modulator circuit 608 begins, preset signals PS1-PS3 preset the signals KB[X-1:0], KC[X-1:0], and KD[X-1:0] stored at the Q outputs of flip-flop circuits 811-813, respectively. In an embodiment, the binary value of each set of signals KB[X-1:0], KC[X-1:0], and KD[X-1:0] is preset to a predefined prime number by preset signals PS1-PS3, respectively. According to an embodiment that is provided as an example and that is not intended to be limiting, the binary value of each set of signals KB[X-1:0], KC[X-1:0], and KD[X-1:0] is preset to 4080761. In other embodiments, each set of signals KB[X-1:0], KC[X-1:0], and KD[X-1:0] is preset to any prime number, i.e., 2, 3, 5, 7, 11, 13, 17, 19, 23, 29, 31, etc. In some embodiments, the predefined prime number that is generated in response to preset signals PS1-PS3 is programmable.

Varying the frequency division value M of feedback counter circuit 606 between 2 or more values can cause an undesired spur in the frequency domain of clock signals VOUT[7:0]. Presetting the binary value of each set of signals KB[X-1:0], KC[X-1:0], and KD[X-1:0] to a predefined prime number introduces randomness into accumulator circuits 801-803 and arithmetic logic circuit 825 that reduces or eliminates the undesired frequency spur in output clock signals VOUT[7:0].

Signals KA[X-1:0] are provided in parallel to inputs of accumulator circuit 801. Accumulator circuit 801 adds the value of signals KA[X-1:0] to the value of signals KB[X-1:0] to generate a sum that is represented by an X number of digital signals AC1 and a digital overflow signal OF1. Digital signals AC1 are provided in parallel to the D inputs of flip-flop circuits 811. Flip-flop circuits 811 store the logic states of the AC1 signals at their Q outputs as an X number of signals KB[X-1:0] in response to each rising edge in feedback clock signal FBCLK.

Linear feedback shift register (LFSR) 815 generates a random digital carry in signal CIN in response to a periodic clock signal CLKR. Carry in signal CIN is provided to an input of accumulator circuit 802. LFSR 815 adds random noise into accumulator circuit 802 that reduces or eliminates the undesired frequency spur in output clock signals VOUT[7:0] caused by changing the frequency division value M of feedback counter circuit 606 between multiple values.

Signals KB[X-1:0] are provided in parallel to inputs of accumulator circuits 801-802. Accumulator circuit 802 adds together the value of signals KB[X-1:0], the value of signals KC[X-1:0], and the value of carry in signal CIN to generate a sum that is represented by an X number of digital signals AC2 and a digital overflow signal OF2. Digital signals AC2 are provided in parallel to the D inputs of flip-flop circuits 812. Flip-flop circuits 812 store the logic states of the AC2 signals at their Q outputs as an X number of signals KC[X-1:0] in response to each rising edge in feedback clock signal FBCLK.

Signals KC[X-1:0] are provided in parallel to inputs of accumulator circuits 802-803. Accumulator circuit 803 adds the value of signals KC[X-1:0] to the value of signals KD[X-

1:0] to generate a sum that is represented by an X number of digital signals AC3 and a digital overflow signal OF3. Digital signals AC3 are provided in parallel to the D inputs of flip-flop circuits 813. Flip-flop circuits 813 store the logic states of the AC3 signals at their Q outputs as an X number of signals KD[X-1:0] in response to each rising edge in feedback clock signal FBCLK. Signals KD[X-1:0] are provided to inputs of accumulator circuit 803.

The digital overflow signals OF1-OF3 are the most significant bits of the sums of the addition functions performed by accumulator circuits 801-803, respectively. The registers in accumulator circuits 801-803 do not have enough storage space to store overflow bits OF1-OF3. The three sets of digital signals AC1-AC3 correspond to the remaining bits of the sums of the addition functions performed by accumulator circuits 801-803, respectively.

Multiplexer circuit 821 receives signals OF1 and KB[X-1:0] at its multiplexing inputs and select signals E1 at its select inputs. Multiplexer circuit 821 provides one of signals OF1 and KB[X-1:0] to its output as carry out signal COUT1 based on the logic states of select signals E1. As an example, X equals 32, and multiplexer circuit 821 is configured to provide signal OF1 or one of signals KB0, KB7, KB15, KB23, or KB31 from signals KB[X-1:0] to its output as signal COUT1. Signal COUT1 is provided to an input of arithmetic logic circuit 825.

Multiplexer circuit 822 receives signals OF2 and KC[X-1:0] at its multiplexing inputs and select signals E2 at its select inputs. Multiplexer circuit 822 provides one of signals OF2 and KC[X-1:0] to its output as carry out signal COUT2 based on the logic states of select signals E2. As an example, X equals 32, and multiplexer circuit 822 is configured to provide signal OF2 or one of signals KC0, KC7, KC15, KC23, or KC31 from signals KC[X-1:0] to its output as signal COUT2. Signal COUT2 is provided to an input of arithmetic logic circuit 825.

Multiplexer circuit 823 receives signals OF3 and KD[X-1:0] at its multiplexing inputs and select signals E3 at its select inputs. Multiplexer circuit 823 provides one of signals OF3 and KD[X-1:0] to its output as carry out signal COUT3 based on the logic states of select signals E3. As an example, X equals 32, and multiplexer circuit 823 is configured to provide signal OF3 or one of signals KD0, KD7, KD15, KD23, or KD31 from signals KD[X-1:0] to its output as signal COUT3. Signal COUT3 is provided to an input of arithmetic logic circuit 825.

Multiplexer circuits 821-823 affect how frequently the values (i.e., logic states) of the carry out signals COUT1-COUT3 change. FPLL circuit 600 can be programmed to select carry out signals COUT1-COUT3 that change less frequently to increase the precision of the average frequencies of the output clock signals VOUT[7:0]. For example, in order to increase the precision of the average frequencies of output clock signals VOUT[7:0], multiplexer circuits 821-823 can be configured by select signals E1-E3 to provide signals KB31, KC31, and KD31 as carry out signals COUT1-COUT3, respectively. Signals KB31, KC31, and KD31 are the second most significant bits of the sums generated by accumulator circuits 801-803, respectively. In this context, the precision of a value refers to the number of digits used to express the value. As an example, the precision of the average frequencies of clock signals VOUT[7:0] can be increased from 1.01 gigahertz (GHz) to 1.011 GHz.

FPLL circuit 600 can be programmed to select carry out signals COUT1-COUT3 that change more frequently to decrease the precision of the average frequencies of the output clock signals VOUT[7:0]. For example, in order to decrease the precision of the average frequencies of output clock signals VOUT[7:0], multiplexer circuits 821-823 can be configured by select signals E1-E3 to provide signals KB0, KC0, and KD0 as carry out signals COUT1-COUT3, respectively. Signals KB0, KC0, and KD0 are the least significant bits of the sums generated by accumulator circuits 801-803, respectively. As an example, the precision of the average frequencies of clock signals VOUT[7:0] can be decreased from 1.13 gigahertz (GHz) to 1.1 GHz.

Arithmetic logic circuit 825 performs the mathematical function shown below in equation (1) on the current and previous states of the carry out signals COUT1-COUT3 to generate the value of signals MDIV. The value of signals MDIV equals the frequency division value M that feedback counter circuit 606 applies to the frequency of clock signal SCLK to generate the frequency of feedback clock signal FBCLK, as described above. Delta sigma modulator circuit 608 varies the value of signals MDIV based on changes in signals COUT1-COUT3 over multiple periods of clock signal FBCLK as shown below in equation (1) to cause feedback counter circuit 606 to divide the frequency of SCLK by 2, 3, 4, 5, 6, 7 or 8 frequency division values to generate the frequency of clock signal FBCLK.

$$MDIV=MN+COUT1+COUT2+COUT3+COUT2'-(2\times COUT3')+COUT3'' \quad (1)$$

The value MN in equation (1) is a nominal integer value that is based on an integer multiplication ratio between the frequency of input clock signal CLKIN and the frequencies of output clock signals VOUT[7:0]. As an example, if output clock signals VOUT[7:0] have frequencies that are 11.25 times the frequency of clock signal CLKIN, then MN equals 11. COUT2' equals the value of signal COUT2 in the period before the current period of clock signal FBCLK. COUT3' equals the value of signal COUT3 in the period before the current period of clock signal FBCLK. COUT3'' equals the value of signal COUT3 in the period of clock signal FBCLK that occurred two periods before the current period of FBCLK.

Figure 9:
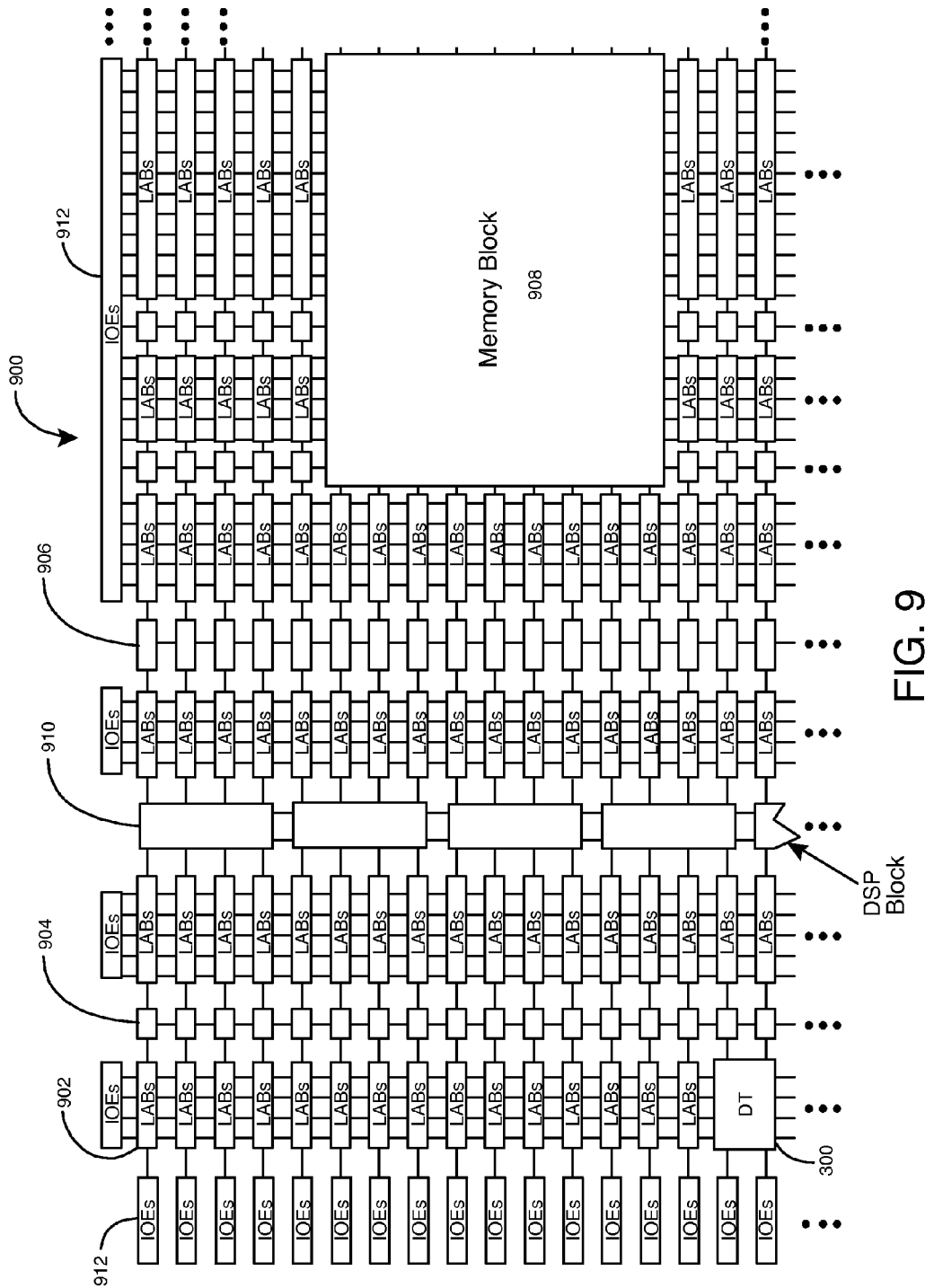
FIG. 9 is a simplified partial block diagram of a field programmable gate array (FPGA) that can include aspects of the present invention.

FIG. 9 is a simplified partial block diagram of a field programmable gate array (FPGA) 900 that can include aspects of the present invention. FPGA 900 is merely one example of an integrated circuit that can include features of the present invention. It should be understood that embodiments of the present invention can be made in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including random access memory (RAM) blocks of varying sizes provided throughout the array. The RAM blocks include, for example, blocks 904, blocks 906, and block 908. These memory blocks can also include shift registers and first-in-first-out (FIFO) buffers.

FPGA 900 further includes digital signal processing (DSP) blocks 910 that can implement, for example, multipliers with add or subtract features. Input/output elements (IOEs) 912 located, in this example, around the periphery of the chip, support numerous single-ended and differential input/output standards. IOEs 912 include input and output buffers that are coupled to pins of the integrated circuit. The pins are external terminals of the FPGA die. Signals such as input signals, output signals, and supply voltages are routed between the FPGA and one or more external devices through the pins. FPGA 900 also has a demultiplexing transponder (DT) circuit 300, which is shown in FIG. 3. It is to be understood that FPGA 900 is described herein for illustrative purposes only and that the present invention can be implemented in many different types of integrated circuits.

Figure 10:
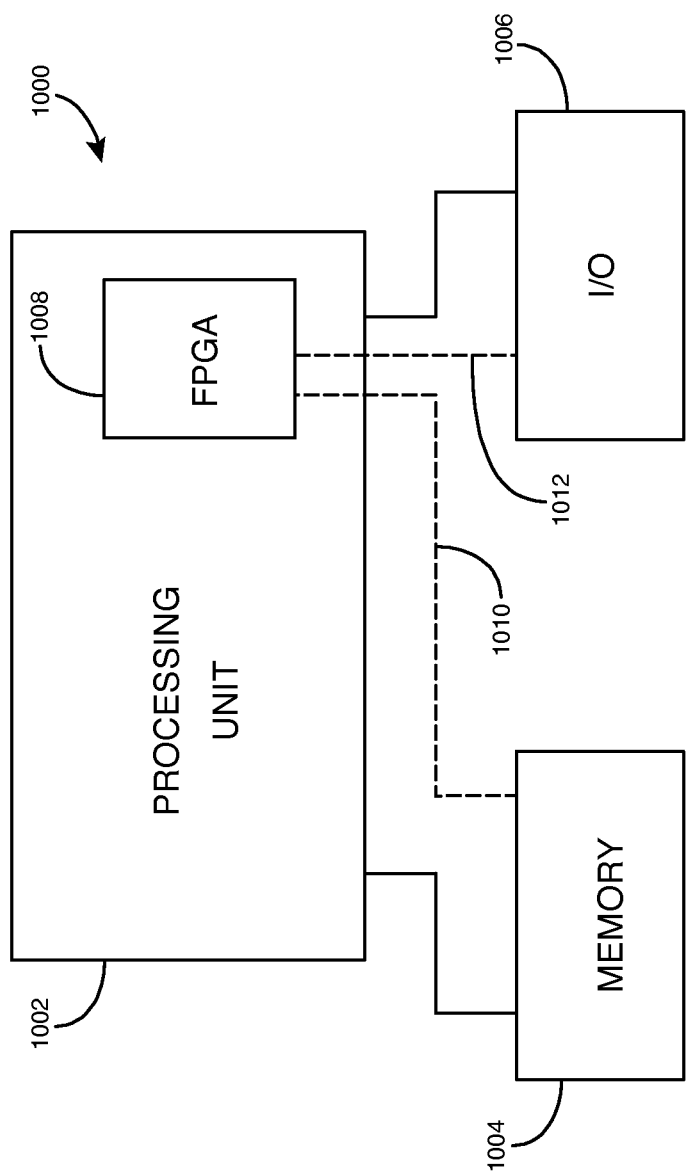
FIG. 10 shows a block diagram of an exemplary digital system that can embody techniques of the present invention.

The present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 10. FPGA 1008 can, for example, be a logical building block of processing unit 1002, supporting its internal and external operations. FPGA 1008 is programmed to implement the functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor that can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a fractional phase-locked loop circuit comprising phase detection circuitry, an oscillator circuit that generates a first periodic signal, and a frequency divider circuit that divides a frequency of the first periodic signal by a frequency division value to generate a frequency of a second periodic signal, wherein the second periodic signal is provided to the phase detection circuitry; and
   a delta sigma modulator circuit comprising a first accumulator that performs a first addition, first storage circuits that store signals based on the first addition received from the first accumulator, a first multiplexer that receives the signals based on the first addition from the first storage circuits and that provides one of the signals based on the first addition as a first selected signal, and a logic circuit that controls the frequency division value based on the first selected signal.

2. The circuit of claim 1 wherein the delta sigma modulator circuit further comprises a second accumulator that performs a second addition, second storage circuits that store signals based on the second addition received from the second accumulator, a second multiplexer that receives the signals based on the second addition from the second storage circuits and that provides one of the signals based on the second addition as a second selected signal, wherein the logic circuit controls the frequency division value based on the first and the second selected signals.

3. The circuit of claim 2 further comprising:
   a linear feedback shift register that generates a carry in signal, wherein the second accumulator performs the second addition based on the carry in signal.

4. The circuit of claim 2 wherein the signals based on the first addition are provided from the first storage circuits to multiplexing inputs of the first multiplexer, to inputs of the first accumulator and to first inputs of the second accumulator, and wherein the signals based on the second addition are provided from the second storage circuits to multiplexing inputs of the second multiplexer and to second inputs of the second accumulator.

5. The circuit of claim 4 wherein the first storage circuits store a prime number in response to first preset signals and the second storage circuits store a prime number in response to second preset signals.

6. The circuit of claim 4 wherein the delta sigma modulator circuit further comprises a third accumulator that performs a third addition, a third multiplexer that receives signals based on the third addition and that provides one of the signals based on the third addition as a third selected signal, wherein the logic circuit controls the frequency division value based on the first, the second, and the third selected signals.

7. The circuit of claim 6 wherein the delta sigma modulator circuit further comprises third storage circuits that store the signals based on the third addition, wherein the signals based on the third addition are provided from the third storage circuits to multiplexing inputs of the third multiplexer and to first inputs of the third accumulator, and wherein the signals based on the second addition are provided from the second storage circuits to second inputs of the third accumulator.

8. The circuit of claim 2 wherein the first multiplexer receives at a multiplexing input a first overflow signal generated by the first accumulator from the first addition, and wherein the second multiplexer receives at a multiplexing input a second overflow signal generated by the second accumulator from the second addition.

9. The circuit of claim 1 wherein the first multiplexer receives signals indicating a sum of the first addition, and wherein the first multiplexer provides a different one of the signals indicating the sum of the first addition as the first selected signal to adjust a precision of an average frequency of the first periodic signal.

10. The circuit of claim 1 wherein a third periodic signal is provided to the phase detection circuitry, and wherein the first periodic signal has an average frequency that equals a frequency of the third periodic signal times a fractional, non-integer number.

11. A method comprising:
generating a first periodic signal using an oscillator circuit;
dividing a frequency of the first periodic signal by a frequency division value to generate a frequency of a second periodic signal using a frequency divider circuit;
providing the second periodic signal to phase detection circuitry, wherein the oscillator circuit, the frequency divider circuit, and the phase detection circuitry are part of a fractional phase-locked loop circuit;
performing a first addition using a first accumulator;
receiving signals that indicate a sum of the first addition at a first multiplexer and providing one of the signals that indicate the sum of the first addition as a first selected signal;
controlling the frequency division value based on the first selected signal using a logic circuit, wherein the first accumulator, the first multiplexer, and the logic circuit are part of a delta sigma modulator circuit; and
changing the one of the signals that indicate the sum of the first addition provided by the first multiplexer as the first selected signal to adjust a precision of an average frequency of the first periodic signal.

12. The method of claim 11 further comprising:
performing a second addition using a second accumulator; and
receiving signals that indicate a sum of the second addition at a second multiplexer and providing one of the signals that indicate the sum of the second addition as a second selected signal,
wherein changing the one of the signals that indicate the sum of the first addition provided by the first multiplexer as the first selected signal to adjust a precision of an average frequency of the first periodic signal further comprises changing the one of the signals that indicate the sum of the second addition provided by the second multiplexer as the second selected signal to adjust the precision of the average frequency of the first periodic signal, and
wherein controlling the frequency division value based on the first selected signal using a logic circuit comprises controlling the frequency division value based on the first and the second selected signals, and wherein the second accumulator and the second multiplexer are part of the delta sigma modulator circuit.

13. The method of claim 12 further comprising:
generating a carry in signal using a linear feedback shift register, wherein performing a second addition using a second accumulator comprises performing the second addition based on the carry in signal.

14. The method of claim 12 further comprising:
storing the signals that indicate the sum of the first addition in first storage circuits;
storing the signals that indicate the sum of the second addition in second storage circuits;
providing the signals that indicate the sum of the first addition from the first storage circuits to multiplexing inputs of the first multiplexer, to inputs of the first accumulator, and to first inputs of the second accumulator; and
providing the signals that indicate the sum of the second addition from the second storage circuits to multiplexing inputs of the second multiplexer and to second inputs of the second accumulator, wherein the first storage circuits and the second storage circuits are part of the delta sigma modulator circuit.

15. The method of claim 14 further comprising:
storing a prime number that is greater than one in the first storage circuits in response to first preset signals; and
storing a prime number that is greater than one in the second storage circuits in response to second preset signals.

16. The method of claim 14 further comprising:
performing a third addition using a third accumulator; and
receiving signals that indicate a sum of the third addition at a third multiplexer and providing one of the signals that indicate the sum of the third addition as a third selected signal,
wherein changing the one of the signals that indicate the sum of the first addition provided by the first multiplexer as the first selected signal to adjust a precision of an average frequency of the first periodic signal further comprises changing the one of the signals that indicate the sum of the third addition provided by the third multiplexer as the third selected signal to adjust the precision of the average frequency of the first periodic signal,
wherein controlling the frequency division value based on the first selected signal using a logic circuit comprises controlling the frequency division value based on the first, the second, and the third selected signals, wherein the third accumulator and the third multiplexer are part of the delta sigma modulator circuit.

17. The method of claim 16 further comprising:
storing the signals that indicate the sum of the third addition in third storage circuits;
providing the signals that indicate the sum of the third addition from the third storage circuits to multiplexing inputs of the third multiplexer and to first inputs of the third accumulator; and
providing the signals that indicate the sum of the second addition from the second storage circuits to second inputs of the third accumulator, wherein the third storage circuits are part of the delta sigma modulator circuit.

18. The method of claim 12 further comprising:
receiving a first overflow signal generated by the first accumulator from the first addition at a multiplexing input of the first multiplexer; and
receiving a second overflow signal generated by the second accumulator from the second addition at a multiplexing input of the second multiplexer.

19. The method of claim 11 further comprising:
providing a third periodic signal to the phase detection circuitry, wherein the average frequency of the first periodic signal equals a frequency of the third periodic signal times a fractional, non-integer number.

20. A circuit comprising:
a fractional phase-locked loop circuit comprising phase detection circuitry, an oscillator circuit that generates a first periodic signal, and a frequency divider circuit that divides a frequency of the first periodic signal by a frequency division value to generate a frequency of a second periodic signal, wherein the second periodic signal is provided to the phase detection circuitry; and a delta sigma modulator circuit comprising a first accumulator that performs a first addition, a first multiplexer that receives signals based on the first addition and that provides one of the signals based on the first addition as a first selected signal, a second accumulator that performs a second addition, a second multiplexer that receives signals based on the second addition and that provides one of the signals based on the second addition as a second selected signal, and a logic circuit that generates the frequency division value by performing a mathematical function on values of the first and the second selected signals.

* * * * *